United States Patent
Mieno

(10) Patent No.: US 8,415,218 B2
(45) Date of Patent: Apr. 9, 2013

(54) ATOMIC LAYER DEPOSITION EPITAXIAL SILICON GROWTH FOR TFT FLASH MEMORY CELL

(75) Inventor: Fumitake Mieno, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 213 days.

(21) Appl. No.: 12/259,128

(22) Filed: Oct. 27, 2008

(65) Prior Publication Data

US 2010/0001334 A1 Jan. 7, 2010

(30) Foreign Application Priority Data

Jul. 2, 2008 (CN) .......................... 2008 1 0040288

(51) Int. Cl.
| | |
|---|---|
| H01L 21/336 | (2006.01) |
| H01L 21/20 | (2006.01) |
| H01L 21/36 | (2006.01) |
| H01L 21/00 | (2006.01) |
| C23C 16/24 | (2006.01) |
| H01L 29/06 | (2006.01) |
| H01L 47/02 | (2006.01) |
| H01L 29/04 | (2006.01) |
| H01L 29/15 | (2006.01) |
| H01L 31/036 | (2006.01) |
| H01L 29/80 | (2006.01) |
| H01L 29/76 | (2006.01) |
| H01L 29/788 | (2006.01) |
| H01L 21/70 | (2006.01) |

(52) U.S. Cl.
USPC .............. 438/257; 438/488; 438/491; 257/7; 257/74; 257/278; 257/314; 257/315; 257/316; 257/390; 257/E21.662; 257/E21.667; 257/E21.671; 257/E27.026; 257/E27.103; 257/E33.077

(58) Field of Classification Search ........................ None
See application file for complete search history.

(56) References Cited

U.S. PATENT DOCUMENTS

| | | | | |
|---|---|---|---|---|
| 7,026,212 | B2* | 4/2006 | Herner et al. | 438/257 |
| 7,242,049 | B2* | 7/2007 | Forbes et al. | 257/315 |
| 2006/0249735 | A1* | 11/2006 | Walker et al. | 257/74 |
| 2006/0267075 | A1* | 11/2006 | Sandhu et al. | 257/316 |
| 2006/0286776 | A1* | 12/2006 | Ranish et al. | 438/478 |
| 2007/0126033 | A1* | 6/2007 | Walker et al. | 257/250 |
| 2007/0187768 | A1* | 8/2007 | Duan et al. | 257/368 |
| 2009/0020802 | A1* | 1/2009 | Ma et al. | 257/316 |

* cited by examiner

Primary Examiner — N Drew Richards
Assistant Examiner — Michael Jung
(74) Attorney, Agent, or Firm — Kilpatrick Townsend & Stockton

(57) ABSTRACT

A method of growing an epitaxial silicon layer is provided. The method comprising providing a substrate including an oxygen-terminated silicon surface and forming a first hydrogen-terminated silicon surface on the oxygen-terminated silicon surface. Additionally, the method includes forming a second hydrogen-terminated silicon surface on the first hydrogen-terminated silicon surface through atomic-layer deposition (ALD) epitaxy from $SiH_4$ thermal cracking radical assisted by Ar flow and flash lamp annealing continuously. The second hydrogen-terminated silicon surface is capable of being added one or more layer of silicon through ALD epitaxy from $SiH_4$ thermal cracking radical assisted by Ar flow and flash lamp annealing continuously. In one embodiment, the method is applied for making devices with thin-film transistor (TFT) floating gate memory cell structures which is capable for three-dimensional integration.

15 Claims, 6 Drawing Sheets

ATOMIC LAYER DEPOSITION EPITAXIAL SILICON GROWTH FOR TFT FLASH MEMORY CELL

CROSS-REFERENCE TO RELATED APPLICATIONS

This application claims priority to Chinese Patent Application No. 200810040288.X, filed Jul. 2, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method for making semiconductor device having a memory cell. Merely by way of example, the invention has been applied to layer-by-layer silicon growth through atomic-layer deposition (ALD) epitaxy for making a device with thin film transistor (TFT) memory cell structure. But it would be recognized that the invention has a much broader range of applicability. For example, the invention can be applied to making silicon-on-insulator (SOI) layer, silicon channel layer, and thin silicon charge trapping layers for a variety of devices including dynamic random access memory devices, static random access memory devices, flash memory devices, three-dimensional memory arrays, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

Over the past, reducing memory devices have been a challenging task. As an example, for non-volatile memory devices the high density memory development is hindered by the inability to scale down the memory cell size without reducing the memory capacitance per unit area. In the past, various conventional techniques have been developed for memory cell structures with reduced dimensions. Unfortunately, these conventional techniques have often been inadequate.

From the above, it is seen that an improved technique for processing semiconductor devices, particularly those including the three-dimensional (3D) memory cell structure, is desired.

BRIEF SUMMARY OF THE INVENTION

The present invention is directed to integrated circuits and their processing for the manufacture of semiconductor devices. More particularly, the invention provides a method for making semiconductor device having a memory cell. Merely by way of example, the invention has been applied to layer-by-layer silicon growth through atomic-layer deposition (ALD) epitaxy for making a device with thin film transistor (TFT) memory cell structure. But it would be recognized that the invention has a much broader range of applicability. For example, the invention can be applied to making silicon-on-insulator (SOI) layer, silicon channel layer, and thin silicon charge trapping layers for a variety of devices including dynamic random access memory devices, static random access memory devices, flash memory devices, three-dimensional memory arrays, and others.

In a specific embodiment, the invention provides a method of growing silicon layer-by-layer. The method includes providing a substrate including an oxygen-terminated silicon surface. Additionally, the method includes forming a first hydrogen-terminated silicon surface on the oxygen-terminated silicon surface. The first hydrogen-terminated silicon surface is associated with a single Si—H bond for each surface silicon atom. Moreover, the method includes forming a second hydrogen-terminated silicon surface on the first hydrogen-terminated silicon surface by breaking the Si—H bond and adding an atomic layer of silicon through atomic layer deposition (ALD) from SiH4 thermal cracking radical assisted by Ar flow and flash lamp annealing continuously. The second hydrogen-terminated silicon surface is associated with two Si—H bonds for each surface silicon atom and is capable of being added another layer of silicon from SiH4 thermal cracking radical assisted by Ar flow and flash lamp annealing continuously.

In another specific embodiment, the invention provides a method of making a thin-film transistor memory cell. The method includes providing a substrate, forming a first insulation layer on the substrate, and forming one or more source or drain regions on the first insulation layer. Each of the one or more source or drain regions is associated with a first surface and including an $N^+$ polysilicon layer, a barrier layer, and a conductive layer. The $N^+$ polysilicon layer is on the barrier layer and the barrier layer overlays the conductive layer. The first surface consists of $N^+$ polysilicon. Additionally, the method includes forming a second insulation layer on the first insulation layer. The second insulation layer is associated with a second surface which is substantially co-planar with the first surface. The method further includes forming a first epitaxial silicon layer overlying the first surface and the second surface. Moreover, the method includes forming a second epitaxial silicon layer sandwiched by an upper silicon dioxide block layer and a bottom silicon dioxide tunnel layer on the first epitaxial silicon layer. The second epitaxial silicon layer is capable of forming a floating gate. The method further includes forming a $P^+$ polysilicon layer on the upper silicon dioxide block layer and forming at least one control gate by patterning the $P^+$ polysilicon layer.

In yet another specific embodiment, the combination of an $N^+$ polysilicon source region, $P^-$ epitaxial silicon channel layer, and an $N^+$ polysilicon drain region is capable of forming a thin-film-transistor (TFT) located under a charge storing floating gate made of a thin undoped epitaxial silicon layer. The TFT can act as an access device for the memory cell. In one embodiment, the device having such a TFT memory cell structure made by the method can be repeatedly integrated in three dimension (3D). Furthermore, in another embodiment, the whole memory cell structure can be implemented in a cross-point memory architecture in which each memory storage element, within the epitaxial silicon floating gate layer, can be sandwiched between an array of orthogonal word lines and bit lines.

Many benefits can be achieved by way of the present invention over conventional techniques. According to certain embodiments, the present invention combines the advantages of high reliability of floating gate made of thin ALD epitaxial silicon layer for charge-trapping, small geometric cell size and layered structure, high field effect mobility of an epitaxially grown silicon channel of the n-p-n thin-film transistor as an access device, and low thermal budget for fabrication and dopant activation within temperature ranges tolerated by the memory cell. In addition, the present invention provides a simple layered process that is compatible with conventional CMOS process technology, easy to scale down the structure, and capable for 3D integration. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method for making semiconductor device having a memory cell. Merely by way of example, the invention has been applied to layer-by-layer silicon growth through atomic-layer deposition (ALD) epitaxy for making a device with thin film transistor (TFT) memory cell structure. But it would be recognized that the invention has a much broader range of applicability. For example, the invention can be applied to making silicon-on-insulator (SOI) layer, silicon channel layer, and thin silicon charge trapping layer for a variety of devices including dynamic random access memory devices, static random access memory devices, flash memory devices, three-dimensional memory arrays, and others.

As discuss above, various conventional techniques have been directed to memory cells with reduced sizes. According to one of the conventional techniques, memory cells are implemented with stacked gate structure. For example, a stack structure is programmed using one or more channel hot-electrons that pass through a source region and a channel region and is then erased by a Fowler-Norheim tunneling effect.

Unfortunately, stacked gate cell structures, being of two-dimensional array type, usually have a smaller memory capacity per unit area as the cell size scales down. One feasible solution is to stack three-dimensionally several layers of memory arrays on top of a Si substrate containing the CMOS support circuitry. According to various embodiments, the present invention provides three dimensional memory cell structures. For example, certain embodiments of the present invention provides an ability to fabricate stackable access device in the memory cell. This brings up an requirement to improve the design of memory cell structure that can fulfill one or more of the following attributes including, stacking ability, small geometry, low leakage current, bi-directional operable, easy integration into a low temperature backend CMOS flow, cost effectiveness, efficiency, etc. Accordingly, various embodiments of the present invention provide a method for growing thin epitaxial silicon layer for thin-film-transistor (TFT) memory cell structure. It is to be understood that the term "TFT memory cell" refers to a class of memory cell structures and is broadly defined.

Figure 1:
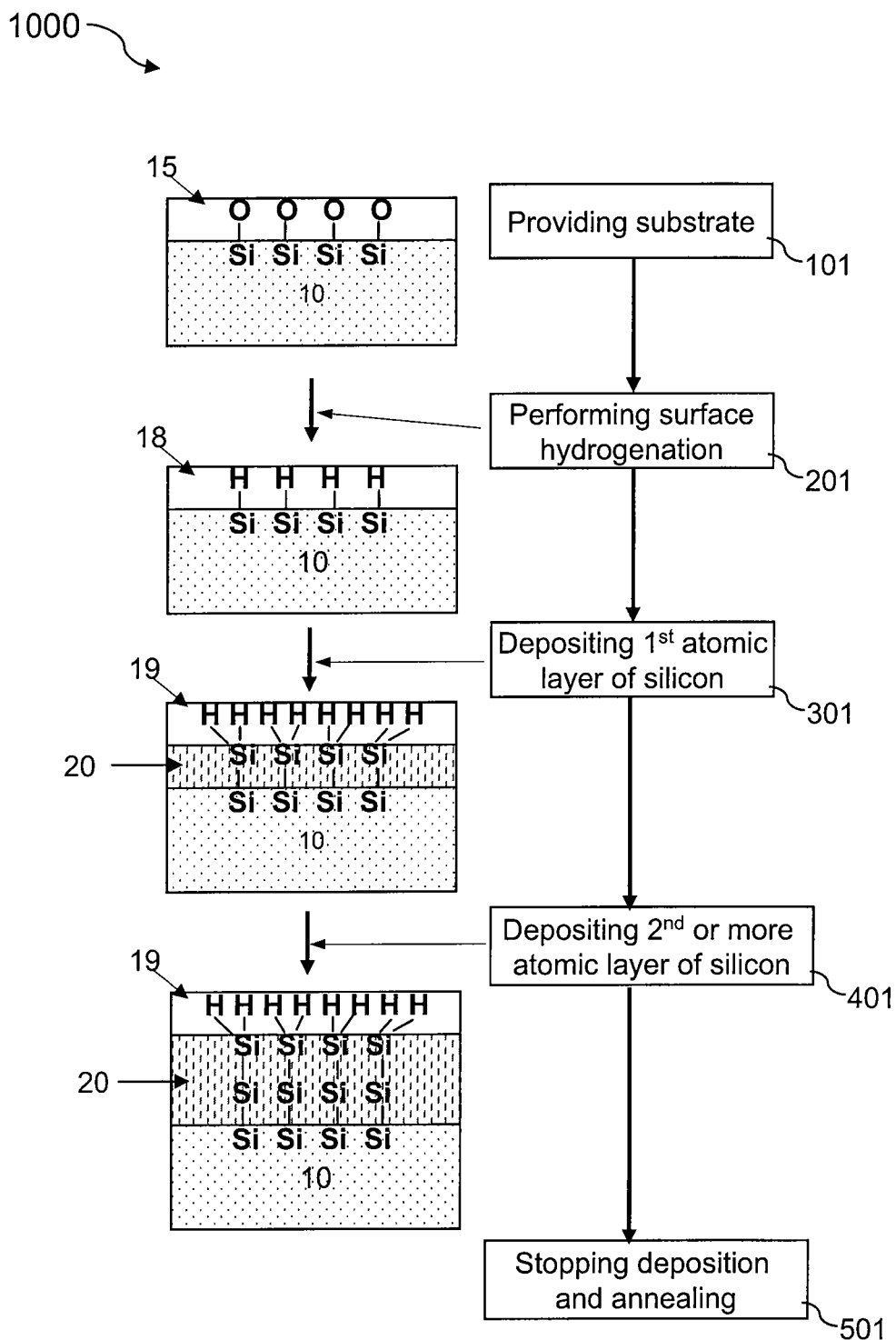
FIG. 1 is a simplified diagram illustrating a method of atomic layer deposition epitaxial silicon growth according to an embodiment of the present invention.

FIG. 1 illustrates a method of atomic layer deposition epitaxial silicon growth according to an embodiment of the present invention. This diagram is merely an example, which should not unduly limit the scope of the claims. One of ordinary skill in the art would recognize many variations, alternatives, and modifications. The method 1000 includes following processes:

1. Process 101: providing a substrate;
2. Process 201: performing surface hydrogenation;
3. Process 301: depositing first atomic layer of silicon;
4. Process 401: depositing second or more layers of silicon by repeating process 301; and
5. Process 501: stopping deposition and annealing.

First, at process 101, a substrate 10 is provided. In one embodiment, the substrate 10 includes a silicon dioxide overlayer which has an oxygen-terminated surface 15. As shown in FIG. 1, "O" schematically represents oxygen atom, "Si"

represents surface silicon atom, and "H" represent hydrogen atom. The short line between the representative atoms is referred to the chemical bond thereof. In one example, the substrate can be a single crystalline silicon or polysilicon wafer with silicon oxide overlayer. In another example, the substrate can be a silicon dioxide passivation layer covering a plurality of active devices. At process 201, the surface of the substrate 10 is treated by a hydrogenation process. Hydrogen gas or radical is supplied to induce chemical reaction on the surface 15 so that the oxygen atom bonded to silicon is replaced by the hydrogen atom, leading to a hydrogen-terminated surface 18, which has a single Si—H bond for each surface silicon atom, as shown in FIG. 1. One of the ordinary skilled in the art may recognize many variations, alternatives, and modifications in the hydrogenation processes and possible surface atomic structures.

Referring to FIG. 1, at process 301, the silicon deposition is performed on the hydrogenated surface 18. Based on an atomic layer deposition technique, a precursor gas silene ($SiH_4$) is supplied and at the same time Ar gas is flowed in and the substrate is heated by a flash lamp. In one embodiment, the whole process is carried within a chamber that has a plasma environment. The heat supplied in the system (either from the flash lamp or the plasma) induces the thermal cracking of the silene to form radical $*SiH_2$: for example, $SiH_4 \rightarrow H_2 + *SiH_2$. Radical $*SiH_2$ is highly reactive on the surface 18 and, assisted by Ar ion in the plasma, is able to break the bond between hydrogen and silicon on the surface and bond with the surface silicon atom. Annealing supplies energy for the surface reaction and helps the reaction to occur in higher rate through diffusion and reduces defects. Thereby, as shown in FIG. 1, one atomic layer of silicon is added on the surface 18 with the surface hydrogen atoms substituted. At the same time, each of the new surface silicon atom, i.e., the first atomic layer of the epitaxial silicon layer 20, still is hydrogen-terminated but with two Si—H bonds, forming a new surface 19. In one embodiment, the process 301, with a proper process parameter setting, may produce a single monolayer of silicon grown epitaxially on the substrate. One of the ordinary skilled in the art may recognize many variations, alternatives, and modifications in the deposition processes with several control parameters such as the precursor gas type, temperature, pressure, gas flow rate, etc. Alternative precursor gases or gas mixtures may be used under process 301 for growing epitaxial silicon, carbon, germanium, compound semiconductors, or any of these layers with certain impurities doped.

Now, at process 401, which is a continuation process after process 301 according to an embodiment of the invention. The $SiH_4$ thermal cracking continues to produce more radical $*SiH_2$ which is capable to react with the new surface 19. The reaction would cause the breakage of one or two Si—H bonds on the surface 19, then each radical $*SiH_2$ replace two hydrogen atoms to bond with the surface silicon again. These reactions continuously lead to the addition of the second, third, or more atomic layers of silicon atoms sequentially on the first layer of epitaxial silicon layer 20. In other words, epitaxial silicon layer 20 becomes one or more atomic layer thicker, as shown in FIG. 1, while keeping its newly formed surface as the same hydrogen-terminated bonding structure as the surface 19. Again, each newly formed surface would be capable of serving a base for further epitaxial growth through the same mechanism.

Process 401 can be performed until the desired thickness of the epitaxial silicon layer is reached. At process 501, the deposition is stopped by turning off the precursor gas supply and Ar flow and pumping out the residue gases. While continuously, thermal annealing is applied with the epitaxial silicon layer grown on the substrate 10. In one example, the thermal annealing can be applied using the flash lamp irradiation. In another example, the thermal annealing can be carried by other rapid thermal processing tools. One of the ordinary skilled in the art may recognize many variations, alternatives, and modifications in the annealing process with several control parameters such as the temperature, pressure, time, ramp rate, etc.

Figure 2:
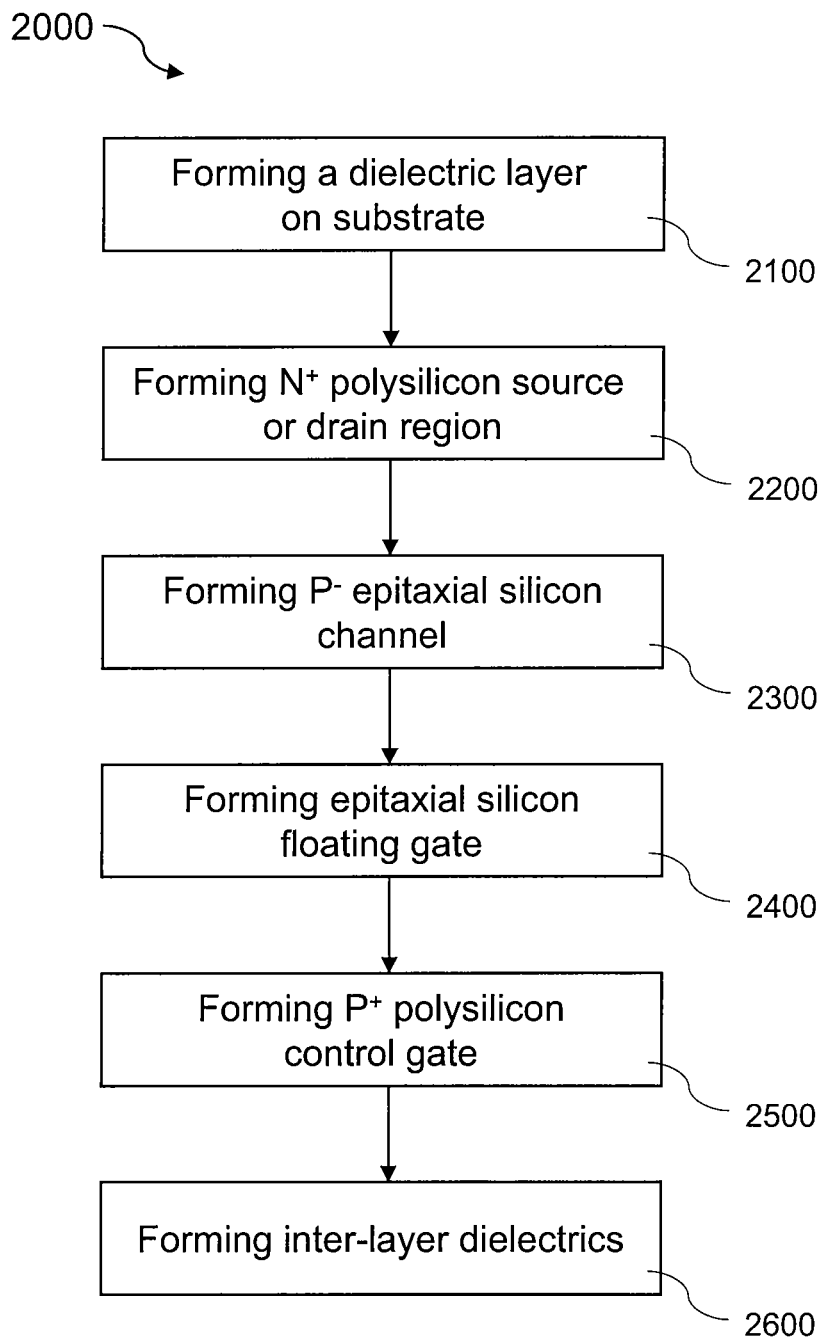
FIG. 2 is a simplified diagram showing a method of manufacturing a TFT floating gate memory cell structure according to an embodiment of the present invention.

The method 1000 has a wide range of applicability to grow thin films for making a variety of semiconductor integrated devices. As an example, the method 1000 can be applied to make a device having TFT floating gate memory cell structures. FIG. 2 is a simplified diagram showing a method for manufacturing a TFT floating gate memory cell structure according to an embodiment of the present invention. This diagram is merely an example, which should not unduly limit the scope of the claims herein. The method 2000 includes the following processes:

1. Process 2100 for forming a first insulation layer on a substrate;
2. Process 2200 for forming $N^+$ polysilicon source or drain region;
3. Process 2300 for forming $P^-$ epitaxial silicon channel;
4. Process 2400 for forming epitaxial silicon floating gate;
5. Process 2500 for forming $P^+$ polysilicon control gate; and
6. Process 2600 for forming inter-layer dielectrics.

The above sequence of processes provides a method according to an embodiment of the present invention. Other alternatives can also be provided where processes are added, one or more processes are removed, or one or more processes are provided in a different sequence without departing from the scope of the claims herein. For example, the method 1000 is applied to grow several epitaxial silicon layers for forming channels or floating gates of semiconductor devices with TFT floating gate memory cell structures. Further details of the present invention can be found throughout the present specification and more particularly below.

Figure 3A:
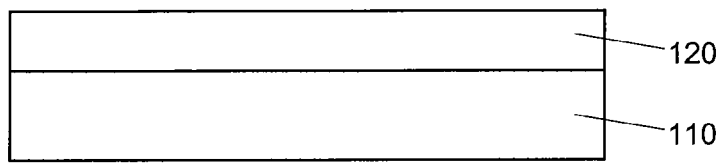
FIG. 3A is a simplified diagram showing a method of forming a first insulation layer on a substrate for making a TFT floating gate memory cell structure according to an embodiment of the present invention.

At the process 2100, an insulation layer is formed on a substrate. FIG. 3A shows a simplified method for forming an insulation layer for manufacturing a semiconductor device with TFT floating gate memory cell structures according to an embodiment of the present invention. This diagram is merely an example, which should not unduly limit the scope of the claims. One of ordinary skill in the art would recognize many variations, alternatives, and modifications.

As shown in FIG. 3A, a starting substrate 110 is provided. For example, the substrate 110 includes silicon. In another example, the substrate 110 includes a plurality of semiconductor devices including a plurality of CMOS memory devices embedded in inter-layer dielectrics with passivation. On the substrate 110, a first insulation layer 120 is formed. In one embodiment, the first insulation layer 120 includes silicon dioxide. For example, the silicon dioxide is formed by thermal oxidation process. In another example, the silicon dioxide layer is deposited by using high-density plasma chemical vapor deposition (HDP-CVD) technique.

Referring to FIG. 2 at process 2200, one or more $N^-$ polysilicon source or drain regions are formed. FIGS. 3B, 3C, 3D, and 3E show a simplified method for forming one $N^+$ polysilicon source or drain region for manufacturing a semiconductor device with TFT floating gate memory cell structures according to an embodiment of the present invention. These diagrams are merely examples, which should not unduly limit the scope of the claims. One of ordinary skill in the art would recognize many variations, alternatives, and modifications.

Figure 3B:
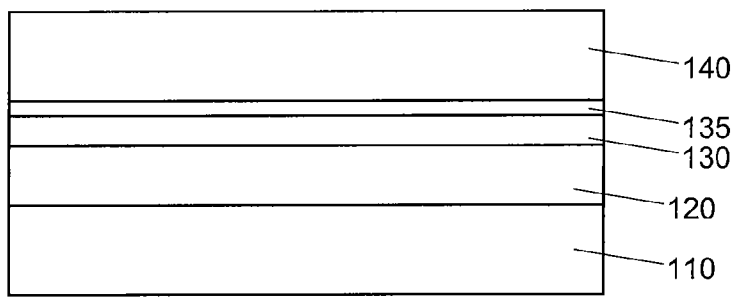
FIG. 3B is a simplified diagram showing a method of forming a conductive layer, a diffusion barrier layer, and a $N^+$ polysilicon layer sequentially for making a TFT floating gate memory cell structure according to an embodiment of the present invention.

As shown in FIG. 3B, on the first insulation layer 120 a first conductive layer 130, a diffusion barrier layer 135, and an N+ polysilicon layer 140 are formed sequentially. In one embodiment, the first conductive layer 130 is made of a metal silicide material. The metal silicide is capable of forming a contact pad for electric coupling. In another embodiment, the first conductive layer 130 can be electrically coupled with memory array bitlines (not shown) embedded in the first insulation layer 120 along a certain direction. In an example, the conductive layer 130 is titanium silicide ($TiSi_2$). In another example, the $TiSi_2$ layer can be formed by various deposition techniques including evaporation, sputtering or CVD. For example, $TiSi_2$ layer is formed through thermal CVD using gas mixture of $SiH_4$ and $TiCl_4$ etc followed by a thermal annealing at 600-800° C.

In yet another embodiment, to reduce the metal inter-diffusion issue, a diffusion barrier layer 135 is deposited overlying the first conductive layer 130 prior the formation of polysilicon layer. For example, the diffusion barrier layer 135 is made of titanium nitride (TiN) material. In another example, TiN layer is deposited with low-pressure chemical vapor deposition (LPCVD) or physical vapor deposition (PVD). Referring again to FIG. 3B, an N+ polysilicon layer 140 is formed on the diffusion barrier layer 135. In one example, the N+ polysilicon layer 140 is deposited through a low pressure CVD with flowing of $SiH_4/PH_3/H_2$ gas mixture at a temperature ranging from 400 to 600 Degrees Celsius, wherein phosphorus is the n-type dopant impurity. Other alternative methods such as plasma-enhanced CVD and atomic layer deposition (ALD) techniques can be used to form the N+ polysilicon layer 140. Obviously, one of ordinary skill in the art would recognize many other alternatives of the N+ polysilicon formation including its dopant types.

Figure 3C:
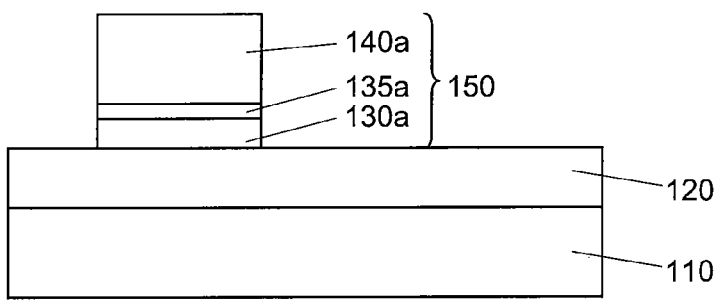
FIG. 3C is a simplified diagram showing a method of forming a source or drain region for making a TFT floating gate memory cell structure according to an embodiment of the present invention.

Still at process 2200, referring to FIG. 3C, according to an embodiment of the present invention, patterning and etching are performed with the sequential layers of 130, 135, and 140. In one embodiment, the patterning is performed with the application of a photoresist layer followed by the UV light exposure under a patterned photo mask. Developing the photoresist layer and strip-cleaning the exposed resist material lead to a surface consisting of partially revealed N+ polysilicon layer 140 and one or more confined regions that are still covered by the resist layer. Furthermore, plasma etching is performed to remove the layers of 130, 135, and 140 that are unmasked until the first insulation layer 120 is revealed. The etching process is anisotropic so that the regions covered by the resist layer pattern are remained. After the resist layer is removed, one or more confined regions 150 are formed as shown in FIG. 3C. In one embodiment, each of the one or more confined regions 150 includes confined portions of N+ polysilicon layer 140a, a diffusion barrier layer 135a, and a first conductive layer 130a. The confined N+ polysilicon layer 140a is located on the confined diffusion barrier layer 135a which overlays the confined first conductive layer 130a.

Figure 3D:
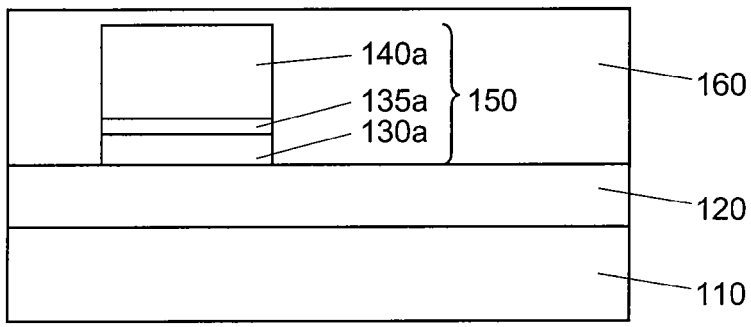
FIG. 3D is a simplified diagram showing a method of forming a second insulation layer around the source or drain region for making a TFT floating gate memory cell structure according to an embodiment of the present invention.

Additionally at process 2200, a second insulation layer 160 is added to completely cover the formed one or more confined regions 150 and the exposed area of the first insulation layer 120, as shown in FIG. 3D. In one embodiment, the second insulation layer 160 includes silicon oxide. For example, the silicon oxide is deposited with high-density-plasma (HDP) Chemical Vapor Deposition. In another example, the silicon oxide is tetraethyl orthosilicate TEOS deposited silicon oxide.

Figure 3E:
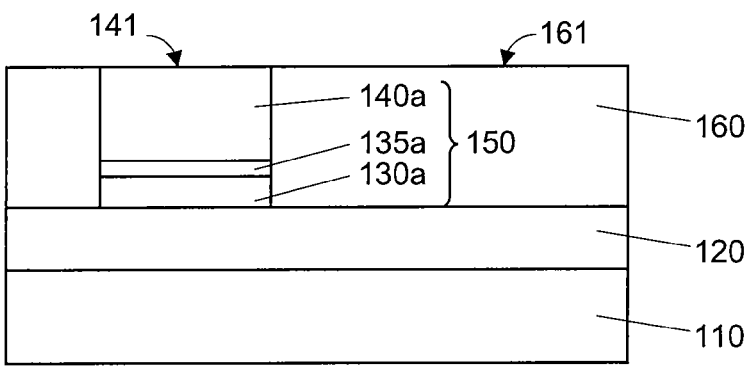
FIG. 3E is a simplified diagram showing a method of forming a co-planar surface of the source or drain region and the second insulation layer for making a TFT floating gate memory cell structure according to an embodiment of the present invention.

Referring to FIG. 3E, still at process 2200, a chemical-mechanical planarization (CMP) process is performed to remove extra amount of the second insulation layer 160 until the N+ polysilicon layer 140a in the confined regions 150 is revealed and a co-planarized surface is formed. The CMP planarized surface includes at least partially the first surface 141 of the N+ polysilicon layer in the regions 140a and partially the second surface 161 of the second insulation layer 160. In another embodiment, combination of a CMP process and a dry etching process or the dry etching process alone can be used to remove extra amount of the second insulation layer 160. In yet another embodiment of the present invention, the second insulation layer 160 is deposited around the confined regions 150 (as shown in FIG. 3C) until the second surface 161 of the second insulation layer 160 is a substantially co-planar with the first surface 141 of the N+ polysilicon in regions 140a. The N+ polysilicon layer 140a within each of the one or more confined regions 150 is embedded in the second insulation layer 150 with a co-planar surface and capable of forming a source or drain region of a memory device. For example, the memory device is the device 100.

Figure 3F:
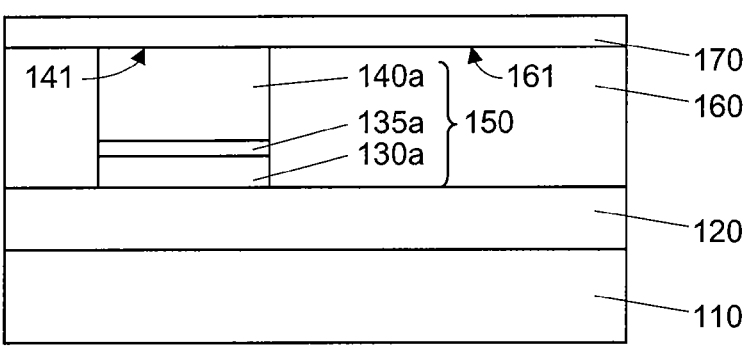
FIG. 3F is a simplified diagram showing a method of forming an epitaxial silicon p-channel of a n-p-n TFT for making a TFT floating gate memory cell structure according to an embodiment of the present invention.

Referring back to FIG. 2 at process 2300, a P− epitaxial silicon channel layer is formed. FIG. 3F shows a simplified method for forming a P− epitaxial silicon channel for manufacturing a semiconductor device with TFT floating gate memory cell structures according to an embodiment of the present invention. This diagram is merely an example, which should not unduly limit the scope of the claims. One of ordinary skill in the art would recognize many variations, alternatives, and modifications.

As shown in FIG. 3F, a P− epitaxial silicon layer 170 is formed overlying the surface 141 of the N+ polysilicon layer 140a in the confined region 150 and the surface 161 of the second insulation layer 160. The P− epitaxial silicon is a lightly doped p-type crystalline silicon layer. A variation of the method 1000 described elsewhere in the specification can be applied to grow the P− epitaxial silicon layer 170. In a specific embodiment, precursor gas of $SiH_4$ with certain $B_2H_6$ mixture is used. Based on the same atomic layer deposition mechanism, the deposition process includes precursor gas thermal cracking which produces radicals *$SiH_2$ mixed with *BH or *$B_2H_2$. Radicals *$SiH_2$ and *BH or *$B_2H_2$ react, assisted by Ar flow and flash lamp annealing, with the co-planar surface 141 and 161 treated with hydrogenation process. The deposition process is carried continuously so that a layer-by-layer growth of silicon mixed with certain level of boron occur on the co-planar surface 141 and 161. The boron atom in the layer becomes the doping impurity atom to make a p-type epitaxial silicon layer. The deposition is stopped when certain thickness of the lightly doped P− epitaxial silicon layer 170 is reached. In another specific embodiment, after the deposition a thermal annealing process is performed. Of course, one of ordinary skill in the art would recognize many other variations, alternatives, and modifications of the process to make P− epitaxial silicon layer including its dopant types. In one embodiment, the P− epitaxial silicon layer 170 is at least partially in contact with the surface 141 of the N+ polysilicon layer 140a in the confined regions 150. In another embodiment, the P− epitaxial silicon layer is capable of forming a p-channel connecting a n-type source region and a n-type drain region, each of the source and drain region is made of N+ polysilicon layer located in a neighboring regions 140a. The P− epitaxial silicon layer is a crystalline silicon with large grain and low defect density, thus the carrier mobility can be greatly enhanced compared to those conventional polysilicon or amorphous silicon-based channels. In another embodiment, such a n-p-n junction forms a thin-film transistor capable of functioning as an access device for the memory cell.

Figure 3G:
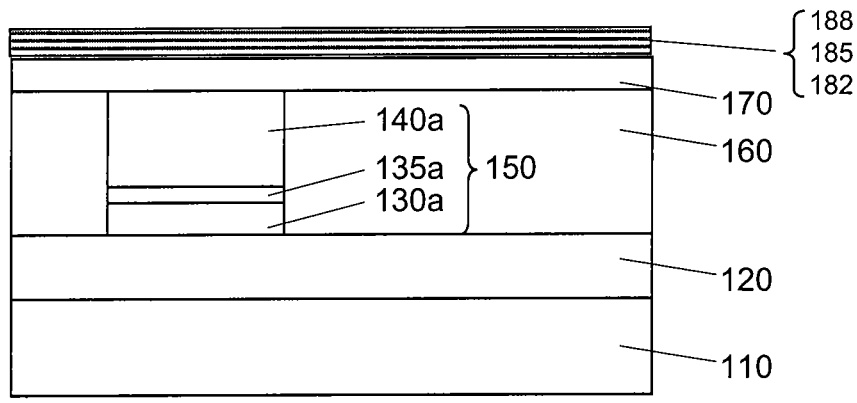
FIG. 3G is a simplified diagram showing a method of forming an epitaxial silicon floating gate for making a TFT floating gate memory cell structure according to an embodiment of the present invention.

Referring again to FIG. 2 at process 2400, an epitaxial silicon floating gate is formed. FIG. 3G shows a simplified method for forming an epitaxial silicon floating gate for manufacturing a semiconductor device with TFT floating gate memory cell structures according to an embodiment of the present invention. This diagram is merely an example, which should not unduly limit the scope of the claims. One of ordinary skill in the art would recognize many variations, alternatives, and modifications.

Referring to FIG. 3G, an epitaxial silicon floating gate 185 is formed on the P⁻ epitaxial silicon layer 170. The epitaxial silicon floating gate 185 is an ALD-deposited epitaxial silicon layer sandwiched by a bottom silicon dioxide layer 182 and an upper silicon dioxide layer 188. In a specific embodiment, the epitaxial silicon floating gate 185 is formed based on the method 1000 described elsewhere in the specification. The ALD epitaxial silicon growth is capable of providing an ultra-thin crystalline silicon layer with controlled morphology and reduced defects. Therefore the formed thin silicon layer for the floating gate can have a thickness down to a few nanometers with reliable charge trapping property. The bottom silicon dioxide layer 182 and upper silicon dioxide layer 188 can be CVD-deposited silicon dioxide layer using $SiH_4$ and $O_2$ as precursors. The bottom silicon dioxide layer 182 forms a tunnel barrier separating the epitaxial silicon floating gate 185 from the P⁻ epitaxial silicon layer 170. When a bias voltage is applied between the N⁺ polysilicon source and a neighbor drain regions 140a, the high mobility hot electrons within the P⁻ epitaxial silicon channel layer may be injected through the bottom silicon dioxide layer 182 into the epitaxial silicon floating gate 185 by the programming electric field. The upper silicon dioxide layer 188 forms a blocking oxide or gate insulation layer, setting a high barrier for the retention of the charges stored in the floating gate 185. In one embodiment, the thicknesses of both upper oxide layer 188 and the bottom oxide layer 182 can be optimized, together with the thin epitaxial silicon floating gate 185, to provide a reduced equivalent total oxide thickness to improve both the access time and charge retention.

Figure 3H:
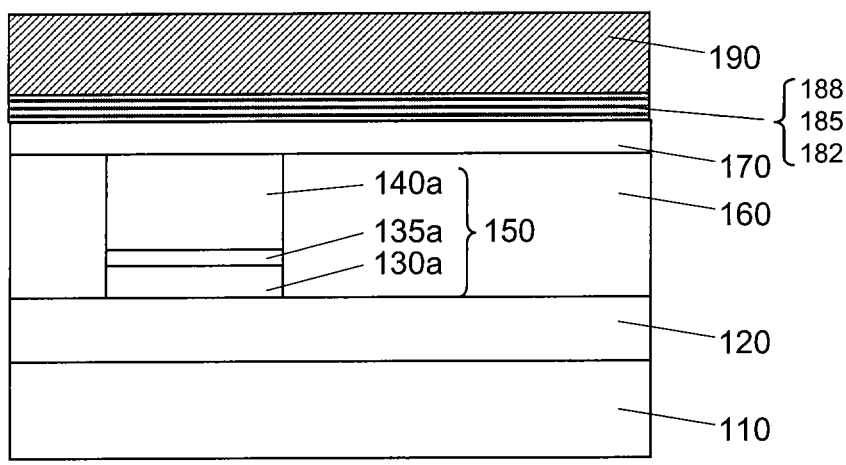
FIG. 3H is a simplified diagram showing a method of forming a control gate for making a TFT floating gate memory cell structure according to an embodiment of the present invention.

At process 2500, a control gate is formed. FIG. 3H shows a simplified method for forming a P⁺ polysilicon control gate for manufacturing a semiconductor device having TFT floating gate memory cell structures according to an embodiment of the present invention. This diagram is merely an example, which should not unduly limit the scope of the claims. One of ordinary skill in the art would recognize many variations, alternatives, and modifications.

As shown in FIG. 3H, a P⁺ polysilicon layer 190 is deposited overlying the upper oxide layer 188. The P⁺ polysilicon layer deposition can be performed using low-pressure CVD with $SiH_4/B_2H_6$ gas mixture at a temperature range from 400 Degrees Celsius to 600 Degrees Celsius followed by a post-deposition annealing treatment. Of course, there can be other process condition variations, modifications, and alternatives.

According to an embodiment of the present invention, a control gate can be formed by patterning the P⁺ polysilicon layer 190. In an embodiment, the patterned control gate is located over the epitaxial silicon floating gate 185 separated only by the upper silicon dioxide layer 188 as a gate dielectrics. In another embodiment, the control gate is patterned to align over the epitaxial silicon p-channel of an n-p-n TFT formed at process 2300, which is associated with at least one N⁺ polysilicon source region and one N⁺ polysilicon drain region. The patterning and etching processes for forming each of the control gate include known methods such as applying photoresist layer, masking, exposing light, developing resist, striping exposed resist residue, polysilicon layer etching and resist layer removing, etc.

In a specific embodiment, each of the patterned control gate can be electrically coupled with memory array word-lines. The memory array wordlines may be configured to be orthogonal to the directions of bitlines of the memory array thereof. Although the detail pattern geometry of the control gate is not explicitly illustrated in FIG. 3H, one of ordinary skilled in the art would recognize many variations, alternatives, and modifications of the gate architectures which should not unduly limit the scope of the claims. At the end of the process 2500, the formation of the control gate completes the formation of the TFT floating gate memory cell structure.

Figure 3I:
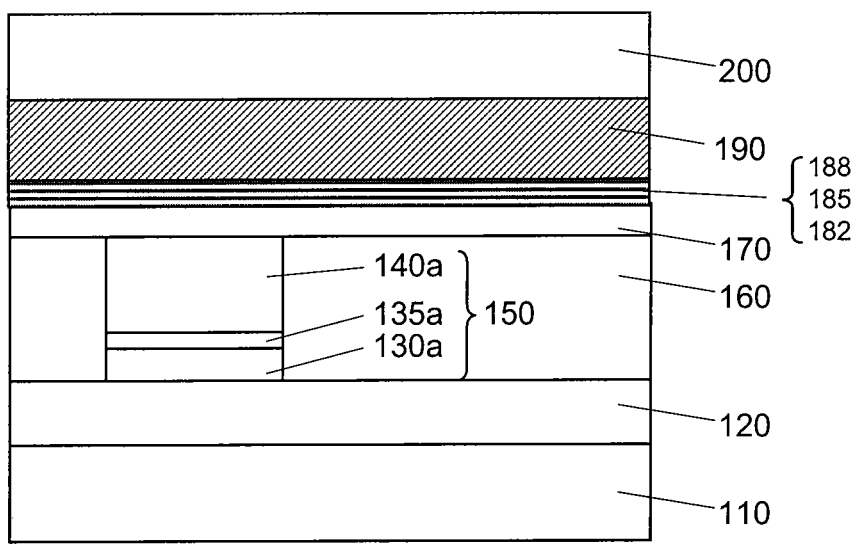
FIG. 3I is a simplified diagram showing a method of forming an inter-layer dielectrics for making three-dimensional TFT floating gate memory cell structures according to an embodiment of the present invention.

Referring back to FIG. 2 at process 2600, an inter-layer dielectrics is formed. FIG. 3I shows a simplified method of forming an inter-layer dielectrics 200 covering a device with TFT floating gate memory cell structures formed at the end of the process 2500. This diagram is merely an example, which should not unduly limit the scope of the claims. One of ordinary skill in the art would recognize many variations, alternatives, and modifications. For example, a plurality of devices with TFT floating gate memory cell structures can be formed at the end of the process 2500 prior to the formation of the inter-layer dielectrics 200. Additionally, metal interconnects (not shown) can be embedded within the inter-layer dielectrics 200 for either bitlines or wordlines of the memory arrays. In another specific embodiment, the TFT floating gate memory cell structures formed though process 2100 to 2600 is three-dimensional stackable. For example, the inter-layer dielectrics may be further planarized by a CMP or an etch back process. The planarized surface of the dielectrics can be used as a substrate. Then the sequence of processes (2100 through 2500) of the method 2000 can be repeated to form another layer of memory arrays having TFT floating gate memory cell structures.

As shown in FIG. 3H, in a specific embodiment, the invention provides a device with TFT floating gate memory cell structures. The device includes a substrate, a dielectric layer on the substrate, and one or more source or drain regions being embedded in the dielectric layer. Each of the one or more source or drain regions includes an N⁺ polysilicon layer, a diffusion barrier layer, and a conductive layer. The N⁺ polysilicon layer having a co-planar surface with the dielectric layer is located on the diffusion barrier layer. The diffusion barrier layer overlays the conductive layer. Additionally, the device includes a lightly doped P⁻ epitaxial silicon layer overlying the co-planar surface of the N⁺ polysilicon layer and the dielectric layer. Moreover, the device includes a floating gate on the P⁻ epitaxial silicon layer. The floating gate is an undoped epitaxial silicon layer sandwiched by a bottom silicon dioxide layer and an upper silicon dioxide layer. The device further includes at least one control gate overlying the upper silicon dioxide layer. In a specific embodiment, the control gate is made of a highly doped P⁺ polysilicon layer.

The method 2000 described above for manufacturing a semiconductor device with TFT floating gate memory cell structures are merely examples which should not unduly limit the scope of the claims herein. There can be many alternatives, modifications, and variations for an ordinary skill in the art. For example, some of the processes may be expanded and/or combined. Other processes may be inserted to those mentioned above. According to a specific embodiment, the method 1000 applied within the method 2000 for making a TFT floating gate memory cell provides an epitaxial silicon p-channel of a thin-film transistor with high carrier mobility as the memory access device, and an epitaxial silicon floating gate with well controlled thickness and low defect density for reliable memory storage. In another embodiment, the method 2000 provides a two-dimensional memory array having the same TFT memory cell structure as shown in FIG. 3H. According to another specific embodiment, the method 2000 can be repeated to stack the memory cell structure in multi-layers, so that a three-dimensional arrays of memory cell structures can be manufactured. The simplicity of the layered structures of N+ polysilicon source or drain regions, the ALD-epitaxial silicon p-channel TFT, and the ALD-epitaxial silicon floating gate, followed by a polysilicon control gate provides excellent scaling ability and easy 3D stackability. For example, the device having TFT floating gate memory cell structures can be embedded in larger chips three-dimensionally with increased memory density per unit area in the vertical direction.

The present invention has various advantages. Some embodiments of the present invention provide a method to grow silicon layer-by-layer using atomic layer deposition epitaxy technique. The method is advantageously applied to make a device with TFT floating gate memory cell structures that is capable for 3D integration. Certain embodiments of the present invention provide an epitaxial silicon p-channel TFT in the memory cell as the memory access device due to high reliability and high field effect mobility. Some embodiments have advantages of high reliability, well-controlled thickness, and low defect density of an epitaxial silicon floating gate as the charge-storing element. Other embodiments provides a method to make reduced and scalable cell size with low thermal budget for fabrication and dopant activation that meet the requirement for 3D memory arrays. Some embodiments of the present invention can reduce transistor leakage current and improve the charge retention time for the memory cell. Certain embodiments of the present invention provide a simple method for making 3D memory array using processes that are fully compatible with established CMOS technology.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of making a thin-film transistor memory cell, the method comprising:
    providing a substrate;
    forming a first insulation layer on the substrate;
    forming one or more source/drain regions on the first insulation layer, each of the one or more source/drain regions including an N-type polysilicon layer, a barrier layer, and a conductive layer, the N-type polysilicon layer having a first surface and being on the barrier layer, the barrier layer overlying the conductive layer;
    forming a second insulation layer on the first insulation layer, the second insulation layer being associated with a second surface, the second surface being substantially co-planar with the first surface;
    forming a first P-type epitaxial silicon layer overlying the first surface and the second surface;
    forming a second epitaxial silicon layer sandwiched by an upper silicon dioxide block layer and a bottom silicon dioxide tunnel layer on the first P-type epitaxial silicon layer, the second epitaxial silicon layer being capable of forming a floating gate;
    forming a P-type polysilicon layer on the upper silicon dioxide block layer; and
    forming at least one control gate by patterning the P-type polysilicon layer,
    wherein forming the second epitaxial silicon layer comprises:
        forming a hydrogenated surface on the bottom silicon dioxide tunnel layer, the hydrogenated surface having a single S—H bond;
        growing a first atomic layer of silicon with H-termination on the hydrogenated surface through ALD epitaxy from $SiH_4$ thermal cracking assisted by Ar flow and flash lamp annealing continuously, wherein the H-termination of the first atomic layer of silicon has two S—H bonds; and
        growing second or more atomic layers of silicon with H-termination sequentially through ALD epitaxy from $SiH_4$ thermal cracking assisted by Ar flow and flash lamp annealing continuously, wherein the H-termination of the subsequent second and more atomic layers of silicon has two S—H bonds.

2. The method of claim 1 wherein the method of forming one or more source/drain regions on the first insulation layer further comprises:
    forming a first conductive layer on the first insulation layer;
    forming a barrier layer on the conductive layer;
    forming an N-type polysilicon layer on the barrier layer; and
    patterning the N-type polysilicon layer, the barrier layer, and the conductive layer to form one or more confined regions including the first surface.

3. The method of claim 2 wherein the first insulation layer comprises silicon dioxide.

4. The method of claim 2 wherein the conductive layer is metal silicide comprising TiSi2.

5. The method of claim 2 wherein the barrier layer is metal-nitride comprising TiN.

6. The method of claim 1 wherein the step of forming a second insulation layer on the first insulation layer further comprises:
    depositing the second insulation layer to cover one or more source/drain regions on the first insulation layer; and
    performing CMP or etch back process or a combination thereof, so as to form the second surface, the second surface being substantially co-planar with the first surface.

7. The method of claim 6 wherein the second insulation layer comprises silicon oxide deposited by high-density-plasma-assisted chemical vapor deposition.

8. The method of claim 6 wherein the second insulation layer comprises TEOS deposited silicon oxide.

9. The method of claim 1 wherein the step of forming a first epitaxial silicon layer overlying the first surface and the second surface comprising:
    turning the co-planar first and second surfaces to a hydrogenated surface with a Si—H bond terminated surface;
    growing a first atomic layer of silicon with H-termination on the hydrogenated surface through ALD epitaxy from SiH4/B2H6 thermal cracking assisted by Ar flow and flash lamp annealing continuously;
    growing second or more atomic layers of silicon with H-termination sequentially through ALD epitaxy from SiH4/B2H6 thermal cracking assisted by Ar flow and flash lamp annealing continuously; and
    performing post-deposition annealing.

10. The method of claim 9 wherein the first epitaxial silicon layer is a crystalline silicon with low-dose p-type boron impurity.

11. The method of claim 1 wherein the first epitaxial silicon layer is capable of forming a channel of a thin film transistor with a N+ polysilicon source/drain.

12. The method of claim 1 wherein the silicon dioxide layers in block layer and tunnel layer can be formed by using low pressure CVD technique with SiH4 and O2 or O3 precursors.

13. The method of claim 1 further comprising:
performing a post-deposition annealing after the epitaxial growth of the second or more atomic silicon layers.

14. The method of claim 1 wherein the P-type polysilicon control gate is positioned over the floating gate made from patterning the second epitaxial silicon layer.

15. The method of claim 1 further comprising repeating the process steps to integrate the memory cell structures three-dimensionally.

* * * * *